United States Patent
Raj et al.

(10) Patent No.: US 9,960,844 B1
(45) Date of Patent: May 1, 2018

(54) ELECTRICALLY TESTING AN OPTICAL RECEIVER

(71) Applicant: Xilinx, Inc., San Jose, CA (US)

(72) Inventors: Mayank Raj, San Jose, CA (US); Yohan Frans, Palo Alto, CA (US); Kun-Yung Chang, Los Altos Hills, CA (US)

(73) Assignee: XILINX, INC., San Jose, CA (US)

( * ) Notice: Subject to any disclaimer, the term of this patent is extended or adjusted under 35 U.S.C. 154(b) by 0 days. days.

(21) Appl. No.: 15/474,588

(22) Filed: Mar. 30, 2017

(51) Int. Cl.
 *H04B 10/00* (2013.01)
 *H04B 10/077* (2013.01)
 *H04B 10/60* (2013.01)

(52) U.S. Cl.
 CPC ......... *H04B 10/0775* (2013.01); *H04B 10/60* (2013.01)

(58) Field of Classification Search
 USPC .................................................. 398/9–38
 See application file for complete search history.

(56) References Cited

U.S. PATENT DOCUMENTS

| | | | | |
|---|---|---|---|---|
| 4,904,088 A * | 2/1990 | Blazek | ...................... | G01J 1/04 250/226 |
| 5,337,250 A * | 8/1994 | Sidiski | ............. | G01R 31/31905 702/117 |
| 6,534,855 B1 * | 3/2003 | Ahn | .................. | H01L 21/76898 257/698 |
| 6,556,318 B1 * | 4/2003 | Goldstein | .......... | H04Q 11/0005 359/224.1 |
| 7,205,845 B2 * | 4/2007 | Harms | .................... | H03F 3/082 330/110 |
| 7,421,213 B2 * | 9/2008 | Harms | ............... | H04B 10/6933 250/214 AG |
| 8,884,205 B2 * | 11/2014 | Ni | .......................... | H04N 3/155 250/208.1 |
| 9,215,114 B2 * | 12/2015 | Emami-Neyestanak | . | H03F 1/08 |
| 2005/0135817 A1 * | 6/2005 | Harms | ............... | H04B 10/6933 398/202 |
| 2006/0001493 A1 * | 1/2006 | Harms | .................... | H03F 3/082 330/308 |
| 2013/0294546 A1 * | 11/2013 | Emami-Neyestanak | | H04L 25/061 375/319 |

(Continued)

OTHER PUBLICATIONS

Frans, Yohan et al., "A 40-to-64 GB/s NRZ Transmitter with Supply-Regulated Front-End in 16 nm FinFET," Proc. of the 2016 IEEE International Solid-State Circuits Conference, Jan. 31, 2016, pp. 1-11, IEEE, Piscataway, New Jersey, USA.

(Continued)

*Primary Examiner* — Agustin Bello
(74) *Attorney, Agent, or Firm* — Robert M. Brush (57) ABSTRACT

An example photodiode emulator circuit includes: a first current source circuit; first and second transistors having sources coupled together and coupled to an output of the first current source circuit, a drain of the second transistor coupled to a first node; a third transistor coupled between a drain of the first transistor and a replica load circuit; a second current source circuit coupled to the first node; a capacitor coupled between the first node and electrical ground; and a fourth transistor having a source coupled to the first node and a drain that supplies an output current.

20 Claims, 6 Drawing Sheets

(56) References Cited

U.S. PATENT DOCUMENTS

2014/0034815 A1* 2/2014 Lai .................. H01L 31/14
                                               250/214 SW
2016/0291086 A1* 10/2016 Chou ................ G01R 31/2884

OTHER PUBLICATIONS

Nazari, Meisam Honarvar et al., "A 24-GB/s Double-Sampling Receiver for Ultra-Low-Power Optical Communication," IEEE Journal of Solid-State Circuits, Feb. 2013, pp. 344-357, vol. 48, No. 2, IEEE, Piscataway, New Jersey, USA.

Raj, Mayank et al., "A 4-to-11GHz Injection-Locked Quarter-Rate Clocking for an Adaptive 153fj/b Optical Receiver in 28nm FDSOI CMOS," Proc. of the 2015 IEEE International Solid-State Circuits Conference, Feb. 22, 2015, 2016, pp. 404-405, IEEE, Piscataway, New Jersey, USA.

* cited by examiner

ELECTRICALLY TESTING AN OPTICAL RECEIVER

TECHNICAL FIELD

Examples of the present disclosure generally relate to electronic circuits and, in particular, to electrically testing an optical receiver.

BACKGROUND

Designing an integrated circuit (IC) involves comprehensive self-testing. Such self-testing becomes more important for ICs having optoelectronic integration. The optical receiver should be tested electrically before being integrated with the photo diode (PD). Previous techniques of electrically testing an optical receiver only allow for adjustment of the data eye opening. Such techniques do not allow emulation of the effect of different photo diode capacitance and/or the effect of changing the optical transmitter laser power.

SUMMARY

In an example, photodiode emulator circuit includes: a first current source circuit; first and second transistors having sources coupled together and coupled to an output of the first current source circuit, a drain of the second transistor coupled to a first node; a third transistor coupled between a drain of the first transistor and a replica load circuit; a second current source circuit coupled to the first node; a capacitor coupled between the first node and electrical ground; and a fourth transistor having a source coupled to the first node and a drain that supplies an output current.

In another example, a test circuit in a receiver includes a data generator configured to generate first and second logic signals that are logical complements of each other, and a photodiode emulator circuit. The photodiode emulator circuit includes: a first current source circuit; first and second transistors having sources coupled together and coupled to an output of the first current source circuit, wherein a drain of the second transistor is coupled to a first node, and gates of the first and second transistors receive the first and second logic signals, respectively; a third transistor coupled between a drain of the first transistor and a replica load circuit; a second current source circuit coupled to the first node; a capacitor coupled between the first node and electrical ground; and a fourth transistor having a source coupled to the first node and a drain that supplies an output current.

In another example, a method of emulating a photodiode at an input of a receiver includes: coupling a photodiode emulator circuit to the input of the receiver; driving a differential input of a differential transistor pair in the photodiode emulator circuit with differential data signals, the differential transistor pair supplying an output current to an output node coupled to the receiver; controlling a first current source of the photodiode emulator circuit to supply a first current to the differential transistor pair; controlling a second current source of the photodiode emulator circuit to supply a second current to the output node; and adjusting capacitance of a capacitor coupled between the output node and electrical ground.

These and other aspects may be understood with reference to the following detailed description.

BRIEF DESCRIPTION OF THE DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

To facilitate understanding, identical reference numerals have been used, where possible, to designate identical elements that are common to the figures. It is contemplated that elements of one example may be beneficially incorporated in other examples.

DETAILED DESCRIPTION

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the claimed invention or as a limitation on the scope of the claimed invention. In addition, an illustrated example need not have all the aspects or advantages shown. An aspect or an advantage described in conjunction with a particular example is not necessarily limited to that example and can be practiced in any other examples even if not so illustrated or if not so explicitly described.

Figure 1:
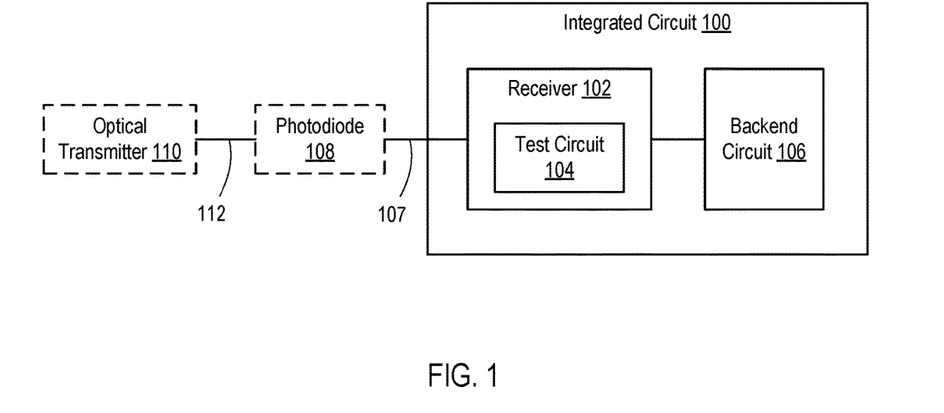
FIG. 1 is a block diagram depicting an integrated circuit according to an example.

FIG. 1 is a block diagram depicting an integrated circuit 100 according to an example. The IC 100 includes a receiver 102 and a backend circuit 106. The receiver 126 can be part of a transceiver (e.g., part of a serializer/deserializer). To form a communication system, the receiver 102 can be coupled to a source circuit through an electrical medium 107 (e.g., printed circuit board (PCB) traces, vias, cables, connectors, decoupling capacitors, and the like). In an optical communication system, the source circuit is a photodiode 108, which is in turn coupled to an optical transmitter 110 through an optical medium 112 (e.g., optical fibers and the like).

In an example, the receiver 102 includes a test circuit 104. The test circuit 104 is configured to emulate the photodiode 108 and generate a test data pattern self-testing of the receiver 102. The test circuit 104 is used to test the receiver 102 electrically before integration with the photodiode 108. Thus, receiver 102 can implement a self-test in absence of the photodiode 108 and the optical transmitter 110. The backend circuit 106 is configured to receive output of the receiver 102. During a self-test of the receiver 102, the backend circuit 106 can verify the output of the receiver against an expected output. Alternatively, the backend circuit 106 can receive and forward output of the receiver 102 to another circuit or system (which can be in the IC 100 or external to the IC 100), which in turn can compare the receiver output against expected output.

Figure 2:
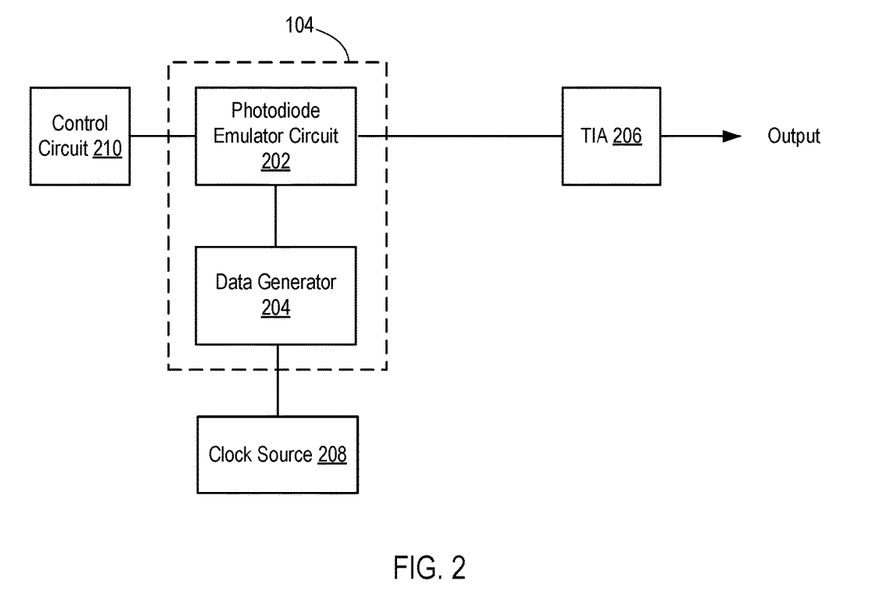
FIG. 2 is a block diagram depicting a test circuit within the receiver of FIG. 1.

FIG. 2 is a block diagram depicting the test circuit 104 within the receiver 102. The test circuit 104 includes a photodiode emulator circuit 202 and a data generator 204. An input of the photodiode emulator circuit 202 is coupled to an output of the data generator 204. An output of the photodiode emulator circuit 202 is coupled to a transimpedance amplifier (TIA) 206 of the receiver 102. An output of the TIA 206 is coupled to other downstream circuitry of the receiver 102 (not shown), such as slicer circuitry, equalizer circuitry, and the like. An input of the data generator 204 is coupled to an output of a clock source 208 in the receiver 102 (e.g., a phase-locked loop (PLL) circuit or the like). In an example, another input of the photodiode emulator circuit 202 is coupled to an output of a control circuit 210. The control circuit 210 can provide one or more control signals to the photodiode emulator circuit 202 for controlling aspects thereof (e.g., an enable signal for turning the photodiode emulator circuit 202 on or off).

Figure 3:
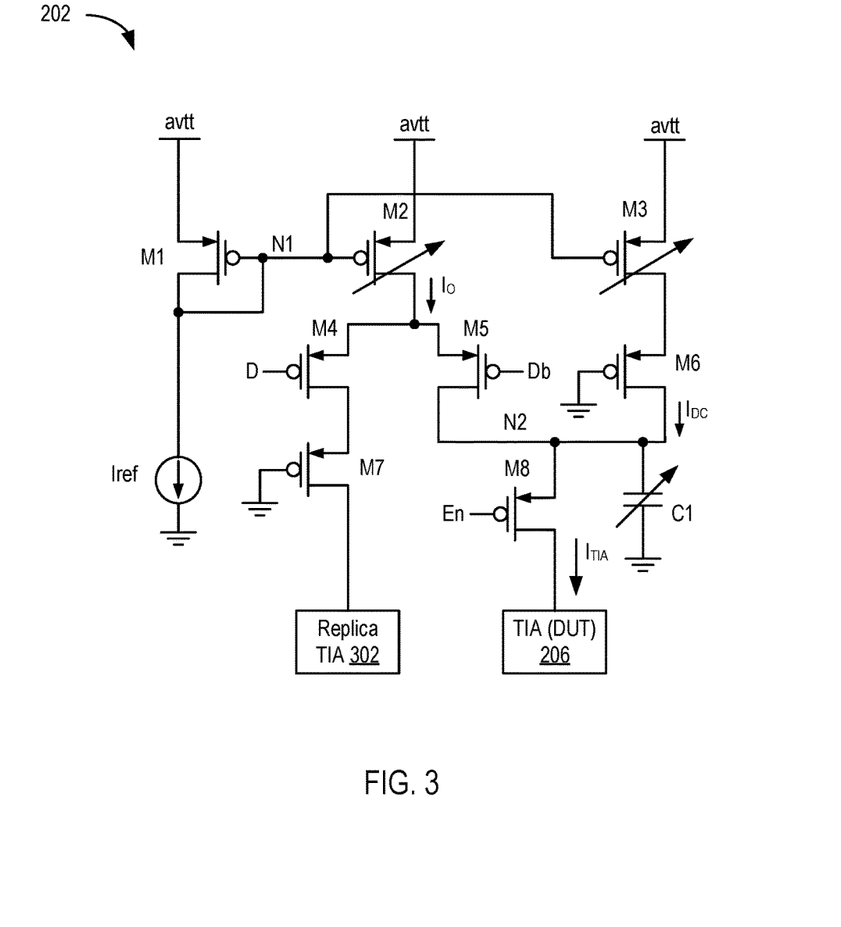
FIG. 3 is a schematic diagram depicting a photodiode emulator circuit according to an example.

FIG. 3 is a schematic diagram depicting the photodiode emulator circuit 202 according to an example. The photodiode emulator circuit 202 includes transistors M1 . . . M8, a current source Iref, a capacitor C1, and a replica TIA 302. The transistors M1 . . . M8 are p-channel field effect transistors (FETs), such as P-type metal-oxide FETs (MOSFETs) (also referred to as PMOS transistors).

The transistors M1 and M2 form a gate-coupled transistor pair. Sources of the transistors M1 and M2 are coupled to a supply voltage (avtt). A drain of the transistor M1 is coupled to the current source Iref. The current source Iref is coupled between the transistor M1 and electrical ground. The gates of the transistors M1 and M2 are coupled to a node N1. The drain of the transistor M1 is also coupled to the node N1.

The transistors M4 and M5 form a source-coupled transistor pair (also referred to as a differential transistor pair). Sources of the transistors M4 and M5 are coupled to a drain of the transistor M2. A drain of the transistor M4 is coupled to a source of the transistor M7. A drain of the transistor M7 is coupled to a replica TIA 302. A gate of the transistor M7 is coupled to electrical ground. A drain of the transistor M5 is coupled to a node N2. A gate of the transistor M4 receives a signal D, and a gate of the transistor M5 receives a signal Db, which is the logical complement of the signal D. The signals D, Db are generated by the data generator 204, as described further below.

A source of the transistor M3 is coupled to the supply voltage avtt. A gate of the transistor M3 is coupled to the node N1. A drain of the transistor M3 is coupled to a source of the transistor M6. A gate of the transistor M6 is coupled to electrical ground. A drain of the transistor M6 is coupled to the node N2.

A source of the transistor M8 is coupled to the node N2. A gate of the transistor M8 receives an enable signal (En). A drain of the transistor M8 is coupled to the TIA 206. The capacitor C1 is coupled between the node N2 and electrical ground.

In operation, the transistors M1 and M2 and the current source Iref collectively form a constant current source that sources a current $I_O$ for biasing the differential transistor pair M4, M5. In general, $(I_O/Iref)=[(W_2/L_2)/(W_1/L_1)]$, where $W_1$ and $L_1$ are the width and the channel length of the transistor M1, respectively, and $W_2$ and $L_2$ are the width and the channel length of the transistor M2, respectively. In an example, the channel lengths of the transistors M1 and M2 are the same or substantially the same. Therefore, the current $I_O$ is equal to the current Iref times the ratio of the width of the transistor M2 to the width of the transistor M1. The current $I_O$ can be varied by varying the effective width of the transistor M2. In an example, the transistor M2 can be implemented using a plurality of transistors selectively coupled in parallel to implement a variable-width transistor. The effective width of the transistor M2 can be controlled by the control circuit 210.

The signals D and Db form a differential input to the differential transistor pair M4, M5. The differential transistor pair M4, M5 functions as a switch that diverts the current $I_O$ either to the left branch (comprising M4, M7, and the replica TIA 302) or the right branch (comprising the transistor M5, the transistor M8, and the TIA 206) depending on the state of the signals D, Db. The differential transistor pair M4, M5 draws a constant current $I_O$ from the constant current source formed by M1, M2, and Iref.

The transistors M3 and M6 form current source that supplies a current $I_{DC}$. Similar to the transistor M2, the transistor M3 can be implemented using a plurality of transistors selectively coupled in parallel to implement a variable-width transistor. The effective width of the transistor M3 can be controlled by the control circuit 210 to control the value of $I_{DC}$.

The transistor M8 functions as a switch based on the state of the signal EN. If the signal EN is logic low, the transistor M8 is on; if the signal EN is logic high, the transistor M8 is off. Thus, the transistor M8 gates the sum of the current supplied by the transistor M5 and the current $I_{DC}$. The transistor M8 ensures that there is no extra capacitive loading on the TIA 206 as a result of the photodiode emulator circuit 202. The capacitor C1 (which can be a fixed or variable capacitance) is added to the node N2 to emulate the capacitance of a photodiode.

The transistor M7 functions as a dummy switch. The replica TIA circuit 302 provides a load that is the same or substantially the same as the TIA 206. The transistor M7 and the replica TIA circuit 302 provide load symmetry with respect to the right branch. The data signals D and Db are generated as described below.

Figure 5:
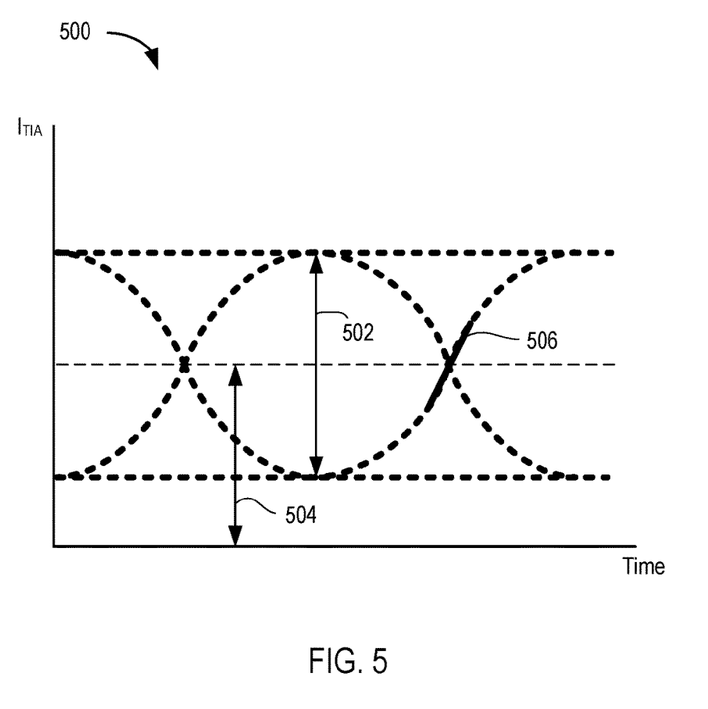
FIG. 5 is a plot of an eye diagram according to an example.

FIG. 5 is a plot of an eye diagram 500 according to an example. In the plot, the horizontal axis represents time and the vertical axis represents the current supplied to the TIA 206. When performing a self-test operation, the control circuit 210 can control the current $I_O$ to adjust data eye opening 502. This emulates the optical modulation amplitude (OMA) of an optical transmitter. The control circuit 210 can control the current $I_{DC}$ to adjust the average current, i.e., to move the data eye up or down while keeping the eye opening the same (as shown by average magnitude 504 in FIG. 5). This emulates the laser power of the optical transmitter. Finally, the control circuit 210 can control the capacitor C1 to adjust the capacitive load and alter slope 506 of the data eye and increase or decrease intersymbol interference (ISI). This emulates the bandwidth restriction of the photodiode.

Figure 6:
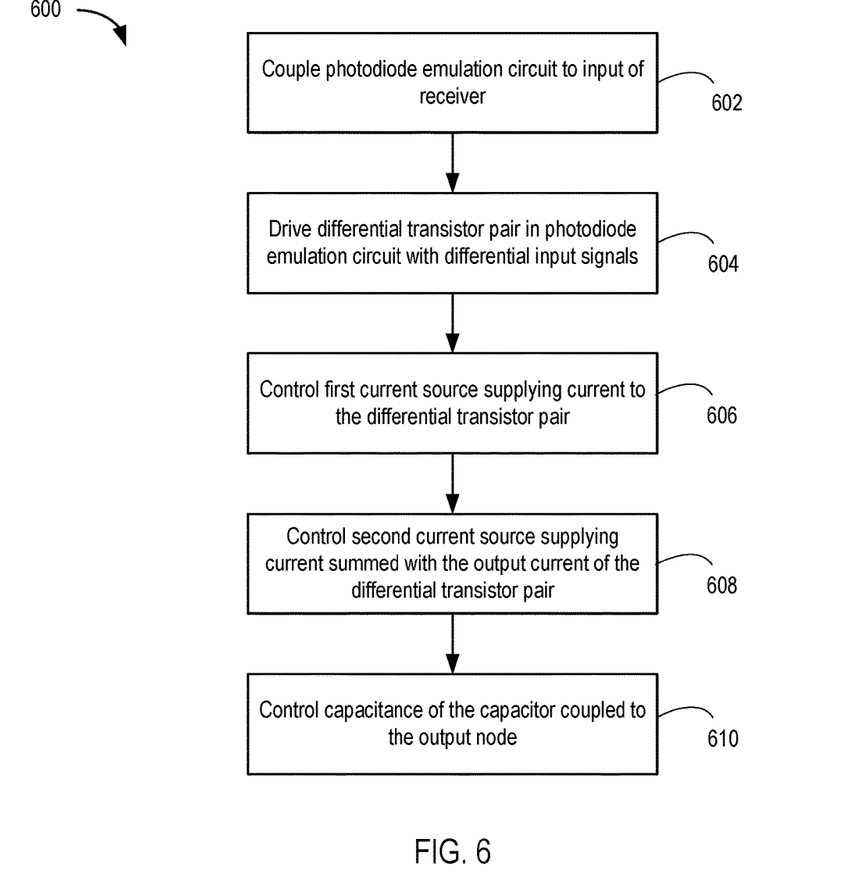
FIG. 6 is a flow diagram depicting a method of emulating a photodiode at an input of a receiver according to an example.

FIG. 6 is a flow diagram depicting a method 600 of emulating a photodiode at an input of a receiver according to an example. The method 600 begins at step 602, where the photodiode emulator circuit 202 is coupled to the input of the receiver 102 (e.g., to the input of the TIA 206). At step 604, the data generator 204 drives the differential transistor pair M4, M5 with differential data signals D, Db. The differential transistor pair M4, M5 supplies an output current to the node N2 (e.g., a time-varying current alternating between substantially zero current and $I_O$).

At step 606, the control circuit 210 controls the current source formed by M1, M2, and Iref to supply the current $I_O$ to the differential transistor pair M4, M5. As discussed above, controlling the current $I_O$ controls the opening 502 of the data eye at the output of the receiver 102. This emulates an OMA of an optical transmitter. As discussed above, the control circuit 210 can control the current $I_O$ by controlling the effective width of the transistor M2 through selectively controlling a number of parallel transistors implementing the transistor M2.

At step 608, the control circuit 210 controls the current source formed by transistors M3 and M6 to supply the current $I_{DC}$ to the output node N2. As discussed above, the control circuit 210 can control the current $I_{DC}$ by controlling the effective width of the transistor M3 through selectively controlling the number of parallel transistors implementing the transistor M3. As discussed above, controlling the current $I_{DC}$ controls the average current supplied to the node N2. This controls the average magnitude 504 of the data eye.

At step 610, the control circuit 210 adjusts capacitance of the capacitor C1. As discussed above, the controlling the capacitor C1 controls the slope 506 of the data eye and is used to emulate the bandwidth of the photodiode.

Figure 4:
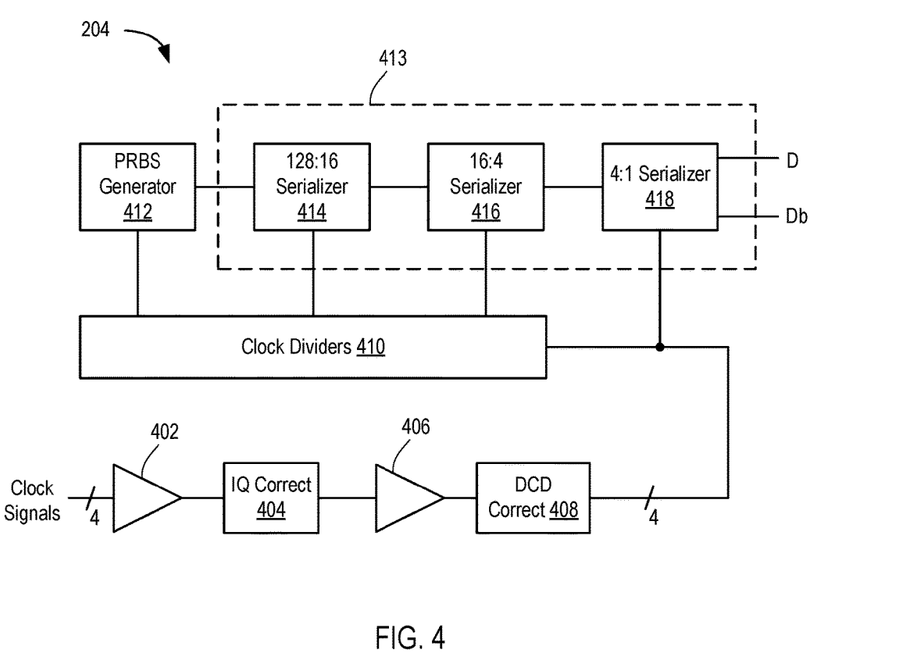
FIG. 4 is a block diagram depicting a data generator according to an example.

FIG. 4 is a block diagram depicting the data generator 204 according to an example. The data generator 204 includes a current-mode logic (CML) buffer 402, an in-phase and quadrature (IQ) correction circuit ("IQ correct 404"), a CML-to-complementary metal oxide semiconductor (CMOS) converter 406, a duty cycle distortion (DCD) correction circuit ("DCD correct 408"), clock dividers 410, a pseudorandom binary sequence (PRBS) generator 412, and at least one serializer circuit 413. In the example, the serializer circuit 413 includes an 128:16 serializer 414, a 16:4 serializer 416, and a 4:1 serializer 418.

An input of the CML buffer 402 receives four clock phases of a clock signal (e.g., 0, 90, 180, and 270 degree clock phases). The clock signals are provided by current-mode logic of a clock generator (e.g., a PLL). An output of the CML buffer 402 is coupled to an input of the IQ correction circuit 404. An output of the IQ correction circuit 404 is coupled to an input of the CML-to-CMOS converter 406. An output of the CML-to-CMOS converter 406 is coupled to the DCD correction circuit 408. An output of the DCD correction circuit 408 is coupled to an input of the clock dividers 410. Outputs of the clock dividers 410 are coupled to the PRBS generator 412, the 128:16 serializer 414, and the 16:4 serializer 416, respectively. The output of the DCD correction circuit 408 is also coupled to an input of the 4:1 serializer 418. An output of the PRBS generator 412 is coupled to an input of the 128:16 serializer 414. An output of the 128:16 serializer 414 is coupled to an input of the 16:4 serializer 416. An output of the 16:4 serializer 416 is coupled to an input of the 4:1 serializer 418. The 4:1 serializer 418 provides the signals D and Db as output. The signals D and Db provide a differential input to the differential transistor pair M4, M5 of the photodiode emulator circuit 202 shown in FIG. 3. The CML buffer 402, IQ correction circuit 404, CML-to-CMOS converter 406, and the DCD correction circuit 408 can be implemented using circuits well known in the art for performing such functions.

In operation, the CML buffer 402 buffers the four-phase clock signals. The IQ correction circuit 404 corrects phase errors of the clock signals output by the CML buffer 402. The CML-to-CMOS converter 406 converts the CML-based clock signals to CMOS-based clock signals. The DCD correction circuit 408 corrects duty cycle errors in the clock signals output by the CML-to-CMOS converter 406. The 4:1 serializer 418 operates based on the clock signals output by the DCD correction circuit 408. The PRBS generator 412, the 128:16 serializer 414, and the 16:4 serializer 416 operated based on respective divided versions of the clock signals output by the DCD correction circuit 408. The PRBS generator 412 generates a pseudorandom binary sequence as output. The serializer 413 converts a parallel output of the PRBS generator 412 into a serial output D. The signal Db is the logical complement of the signal D.

The PRBS generator 412 operates at 128 times slower frequency than the input clock signals. In the example, the output of the PRBS generator 412 is serialized using three stages. The clock signals for the first two stages are generated by appropriately dividing the frequency of the input clock signals. The input clock signals are directly used by the last stage of serialization.

Figure 7:
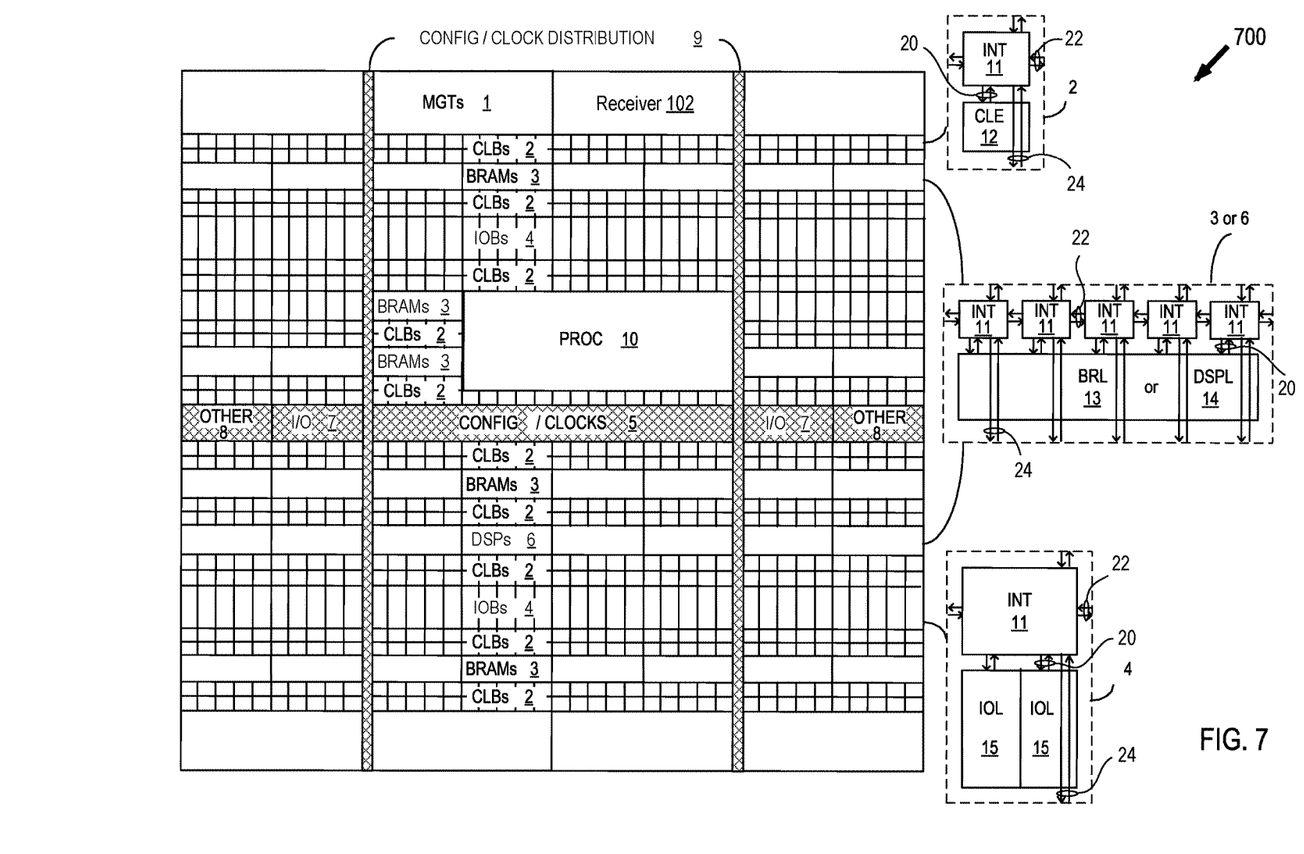
FIG. 7 is a block diagram illustrating an example field programmable gate array (FPGA) in which the receiver of FIG. 1 can be used.

The receiver 102 described above can be implemented within an integrated circuit, such as a field programmable gate array (FPGA) or like type programmable circuit. FIG. 7 illustrates an architecture of FPGA 700 that includes a large number of different programmable tiles including multi-gigabit transceivers ("MGTs") 1, configurable logic blocks ("CLBs") 2, random access memory blocks ("BRAMs") 3, input/output blocks ("IOBs") 4, configuration and clocking logic ("CONFIG/CLOCKS") 5, digital signal processing blocks ("DSPs") 6, specialized input/output blocks ("I/O") 7 (e.g., configuration ports and clock ports), and other programmable logic 8 such as digital clock managers, analog-to-digital converters, system monitoring logic, and so forth. Some FPGAs also include dedicated processor blocks ("PROC") 10. FPGA 700 can include one or more instances of the receiver 102 described above (e.g., within an MGT 1 or as stand-along circuit(s)).

In some FPGAs, each programmable tile can include at least one programmable interconnect element ("INT") 11 having connections to input and output terminals 20 of a programmable logic element within the same tile, as shown by examples included at the top of FIG. 7. Each programmable interconnect element 11 can also include connections to interconnect segments 22 of adjacent programmable interconnect element(s) in the same tile or other tile(s). Each programmable interconnect element 11 can also include connections to interconnect segments 24 of general routing resources between logic blocks (not shown). The general routing resources can include routing channels between logic blocks (not shown) comprising tracks of interconnect segments (e.g., interconnect segments 24) and switch blocks (not shown) for connecting interconnect segments. The interconnect segments of the general routing resources (e.g., interconnect segments 24) can span one or more logic blocks. The programmable interconnect elements 11 taken together with the general routing resources implement a programmable interconnect structure ("programmable interconnect") for the illustrated FPGA.

In an example implementation, a CLB 2 can include a configurable logic element ("CLE") 12 that can be programmed to implement user logic plus a single programmable interconnect element ("INT") 11. A BRAM 3 can include a BRAM logic element ("BRL") 13 in addition to one or more programmable interconnect elements. Typically, the number of interconnect elements included in a tile depends on the height of the tile. In the pictured example, a BRAM tile has the same height as five CLBs, but other numbers (e.g., four) can also be used. A DSP tile 6 can include a DSP logic element ("DSPL") 14 in addition to an appropriate number of programmable interconnect elements. An IOB 4 can include, for example, two instances of an input/output logic element ("IOL") 15 in addition to one instance of the programmable interconnect element 11. As will be clear to those of skill in the art, the actual I/O pads connected, for example, to the I/O logic element 15 typically are not confined to the area of the input/output logic element 15.

In the pictured example, a horizontal area near the center of the die (shown in FIG. 7) is used for configuration, clock, and other control logic. Vertical columns 9 extending from this horizontal area or column are used to distribute the clocks and configuration signals across the breadth of the FPGA.

Some FPGAs utilizing the architecture illustrated in FIG. 7 include additional logic blocks that disrupt the regular columnar structure making up a large part of the FPGA. The additional logic blocks can be programmable blocks and/or dedicated logic. For example, processor block 10 spans several columns of CLBs and BRAMs. The processor block 10 can various components ranging from a single microprocessor to a complete programmable processing system of microprocessor(s), memory controllers, peripherals, and the like.

Note that FIG. 7 is intended to illustrate only an exemplary FPGA architecture. For example, the numbers of logic blocks in a row, the relative width of the rows, the number and order of rows, the types of logic blocks included in the rows, the relative sizes of the logic blocks, and the interconnect/logic implementations included at the top of FIG. 7 are purely exemplary. For example, in an actual FPGA more than one adjacent row of CLBs is typically included wherever the CLBs appear, to facilitate the efficient implementation of user logic, but the number of adjacent CLB rows varies with the overall size of the FPGA.

While the foregoing is directed to specific examples, other and further examples may be devised without departing from the basic scope thereof, and the scope thereof is determined by the claims that follow.

What is claimed is:

1. A photodiode emulator circuit, comprising:
    a first current source circuit;
    first and second transistors having sources coupled together and coupled to an output of the first current source circuit, a drain of the second transistor coupled to a first node;
    a third transistor coupled between a drain of the first transistor and a replica load circuit;
    a second current source circuit coupled to the first node;
    a capacitor coupled between the first node and electrical ground; and
    a fourth transistor having a source coupled to the first node and a drain that supplies an output current.

2. The photodiode emulator circuit of claim 1, wherein a gate of the first transistor receives a first logic signal, a gate of the second transistor receives a second logic signal, and the first and second logic signals are logical complements of each other.

3. The photodiode emulator circuit of claim 2, wherein the gate of the fourth transistor receives a third logic signal.

4. The photodiode emulator circuit of claim 1, wherein the gate of the third transistor is coupled to the electrical ground.

5. The photodiode emulator circuit of claim 1, wherein the first current source circuit comprises:
    fifth and sixth transistors having gates coupled together at a second node, where sources of the fifth and sixth transistors are coupled to a supply voltage, a drain of the sixth transistor is the output of the first current source circuit, and a drain of the fifth transistor is coupled to the second node; and
    a current source coupled between the second node and the electrical ground.

6. The photodiode emulator circuit of claim 5, wherein the second current source comprises:
    a seventh transistor having a source coupled to the supply voltage, a gate coupled to the second node, and a drain;
    an eighth transistor having a source coupled to the drain of the seventh transistor, a gate coupled to the electrical ground, and a drain coupled to the first node.

7. A test circuit in a receiver, comprising:
    a data generator configured to generate first and second logic signals that are logical complements of each other; and
    a photodiode emulator circuit, comprising:
        a first current source circuit;
        first and second transistors having sources coupled together and coupled to an output of the first current source circuit, wherein a drain of the second transistor is coupled to a first node, and gates of the first and second transistors receive the first and second logic signals, respectively;
        a third transistor coupled between a drain of the first transistor and a replica load circuit;
        a second current source circuit coupled to the first node;
        a capacitor coupled between the first node and electrical ground; and
        a fourth transistor having a source coupled to the first node and a drain that supplies an output current.

8. The test circuit of claim 7, wherein a gate of the first transistor receives a first logic signal, a gate of the second transistor receives a second logic signal, and the first and second logic signals are logical complements of each other.

9. The test circuit of claim 8, wherein the gate of the fourth transistor receives a third logic signal.

10. The test circuit of claim 7, wherein the gate of the third transistor is coupled to the electrical ground.

11. The test circuit of claim 7, wherein the first current source circuit comprises:
    fifth and sixth transistors having gates coupled together at a second node, where sources of the fifth and sixth transistors are coupled to a supply voltage, a drain of the sixth transistor is the output of the first current source circuit, and a drain of the fifth transistor is coupled to the second node; and
    a current source coupled between the second node and the electrical ground.

12. The test circuit of claim 11, wherein the second current source comprises:
    a seventh transistor having a source coupled to the supply voltage, a gate coupled to the second node, and a drain;
    an eighth transistor having a source coupled to the drain of the seventh transistor, a gate coupled to the electrical ground, and a drain coupled to the first node.

13. The test circuit of claim 7, wherein the data generator comprises:
    a current-mode logic (CML) buffer;
    an in-phase and quadrature (IQ) correction circuit coupled to an output of the CML buffer;
    a CML-to-complementary metal oxide semiconductor (CMOS) circuit coupled to an output of the IO correction circuit;
    a duty-cycle distortion (DCD) correction circuit coupled to an output of the CML-to-CMOS circuit;
    a plurality of clock dividers coupled to an output of the DCD correction circuit;

a pseudorandom binary sequence generator (PRBS) coupled to a first output of the plurality of clock dividers; and a serializer circuit coupled to an output of the PRBS generator, to at least additional output of the plurality of clock dividers, and to the output of the DCD correction circuit, the serializer outputting the first and second logic signals.

14. A method of emulating a photodiode at an input of a receiver, comprising:

coupling a photodiode emulator circuit to the input of the receiver;

driving a differential input of a differential transistor pair in the photodiode emulator circuit with differential data signals, the differential transistor pair supplying an output current to an output node coupled to the receiver;

controlling a first current source of the photodiode emulator circuit to supply a first current to the differential transistor pair;

controlling a second current source of the photodiode emulator circuit to supply a second current to the output node; and adjusting capacitance of a capacitor coupled between the output node and electrical ground.

15. The method of claim 14, wherein the step of driving comprises:

generating a first signal based on a pseudorandom binary sequence; and serializing the first signal to generate the differential data signals.

16. The method of claim 14, wherein the first current is controlled to control an opening of a data eye at an output of the receiver.

17. The method of claim 14, wherein the second current is controlled to control an average current supplied to the output node.

18. The method of claim 14, wherein the capacitance is adjusted to control a slope of a data eye at an output of the receiver.

19. The method of claim 14, wherein the output node is coupled to a transimpedance amplifier (TIA) of the receiver.

20. The method of claim 14, wherein the first current is controlled to emulate an optical modulation amplitude (OMA) of an optical transmitter, the second current is controlled to control the average magnitude of a data eye at an output of the receiver, and wherein the capacitance is adjusted to emulate a bandwidth of the photodiode.

* * * * *